(12) United States Patent
Kelaher et al.

(10) Patent No.: US 9,247,673 B2
(45) Date of Patent: Jan. 26, 2016

(54) AIR BAFFLE SYSTEM IN A COOLING SYSTEM FOR ELECTRONICS

(71) Applicant: International Business Machines Corporation, Armonk, NY (US)

(72) Inventors: Daniel P. Kelaher, Holly Springs, NC (US); William M. Megarity, Roxboro, NC (US); John P. Scavuzzo, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 647 days.

(21) Appl. No.: 13/628,166

(22) Filed: Sep. 27, 2012

(65) Prior Publication Data
US 2014/0086732 A1    Mar. 27, 2014

(51) Int. Cl.
F04D 29/64 (2006.01)
H05K 7/20 (2006.01)

(52) U.S. Cl.
CPC .......... H05K 7/20172 (2013.01); F04D 29/646 (2013.01); H05K 7/20145 (2013.01); Y10T 29/49238 (2015.01)

(58) Field of Classification Search
None
See application file for complete search history.

(56) References Cited

U.S. PATENT DOCUMENTS

| | | | |
|---|---|---|---|
| 4,150,784 A | 4/1979 | Moorman et al. | |
| 6,005,770 A | 12/1999 | Schmitt | |
| 6,021,042 A | 2/2000 | Anderson et al. | |
| 6,031,717 A | 2/2000 | Baddour et al. | |
| 6,108,203 A | 8/2000 | Dittus et al. | |
| 6,388,880 B1 | 5/2002 | El-Ghobashy et al. | |
| 7,417,856 B2 * | 8/2008 | Chiu et al. | 361/695 |
| 8,422,227 B2 * | 4/2013 | Lai | 361/695 |
| 2007/0081888 A1 | 4/2007 | Harrison | |
| 2011/0080701 A1 | 4/2011 | Bisson et al. | |
| 2011/0184568 A1 | 7/2011 | Tai et al. | |
| 2012/0014811 A1 * | 1/2012 | Wei | 417/1 |
| 2012/0058718 A1 * | 3/2012 | Tang | 454/251 |

OTHER PUBLICATIONS

Joo et al., "Performance Analysis of Dual-Fan, Dual-Duct Constant Volume Air-Handling Units", Proceedings of the First International Conference for Enhanced Building Operations, Jul. 16-19, 2001, Austin, TX., Published by Energy Systems Laboratory, Texas A&M University, 2001. http://hdl.handle.net/1969.1/5163.

* cited by examiner

*Primary Examiner* — Christopher Verdier
*Assistant Examiner* — Justin Seabe
(74) *Attorney, Agent, or Firm* — Jennifer Anda; Richard A. Wilhelm

(57) ABSTRACT

A cooling apparatus of an array of fan cradles holding fans where a movable baffle assembly directs airflow and blocks removal of more than one fan at a time. A plurality of fans held in a fan cradle assembly in which the fan cradle for a fan to be replaced mechanically moves and is engaged with the movable baffle assembly to prevent removal of the other fans. A method is provided by which an operator may remove and replace an existing fan in an array of fans.

14 Claims, 3 Drawing Sheets

US 9,247,673 B2

AIR BAFFLE SYSTEM IN A COOLING SYSTEM FOR ELECTRONICS

TECHNICAL FIELD

This disclosure relates generally to cooling systems for electronics and more particularly to a cooling system that redirects airflow when removing a fan and provides for removal of only one fan in an array of fans at a time.

BACKGROUND

One aspect of thermally managing and maintaining electronic systems involves properly cooling equipment to provide for reliability and proper performance. Properly cooling equipment typically requires generating airflow to remove heat generated by the equipment and maintain the temperature of various components within a suitable operating range. Air moving in parallel airflow paths impelled by air moving devices such as fans cools the components.

An individual fan may not supply the cooling needs of a system as a whole. Thus, multiple fans operate simultaneously to achieve the airflow necessary to cool the system. Though overall cooling system fan configurations vary, each individual fan in an array of fans contributes to the overall airflow. In addition, systems that use forced air cooling frequently use multiple fans so that if one fan fails another can continue to provide cooling for the system.

SUMMARY

In an embodiment, this disclosure relates to a cooling apparatus to direct and redirect airflow when removing and replacing a fan while also providing for removal of only one fan at a time through use of a movable baffle assembly. The cooling apparatus may include at least two fan cradles, at least two fans, and the movable baffle assembly. The movable baffle assembly may direct and redirect airflow and also may block removal of at least one fan.

In an embodiment, the cooling apparatus may be positioned in a home position directing airflow and blocking removal of fans or may be positioned in a swap position redirecting airflow and blocking removal of a fan. In another embodiment, this disclosure relates to a method for an operator to remove and replace an existing fan in an array of fans by manipulating a baffle, substituting fans, and manipulating a fan cradle where the baffle assembly blocks removal of fans still operating.

DETAILED DESCRIPTION

Information technology systems such as servers, storage systems, and switches generate significant amounts of heat and often require numerous fans to cool the components. In many such settings, the impracticalities of shutting down a system to remove and replace fans call for the maximization of system uptime by swapping fans without shutting down the system, or hot-swapping. To continue cooling of the system as a whole, other fans must stay in place when removing and replacing a fan. When removing and replacing a fan, the system may cool better by allocating airflow from a remaining fan or fans to the area previously cooled by the fan being removed and replaced.

An aspect of the disclosure includes limiting the number of nonoperational fans by removing only one fan at a time during replacement. Another aspect of the disclosure includes allocating airflow from operational fans to an area previously cooled by a nonoperational fan. This may deter overheating or cause less stress on components in the area the nonoperational fan no longer cools. This may help components that have less ability to throttle and protect themselves from overheating. Embodiments of the described disclosure include an apparatus that can direct and redirect airflow when removing and replacing a fan while also providing for removal of only one fan at a time.

Figure 1:
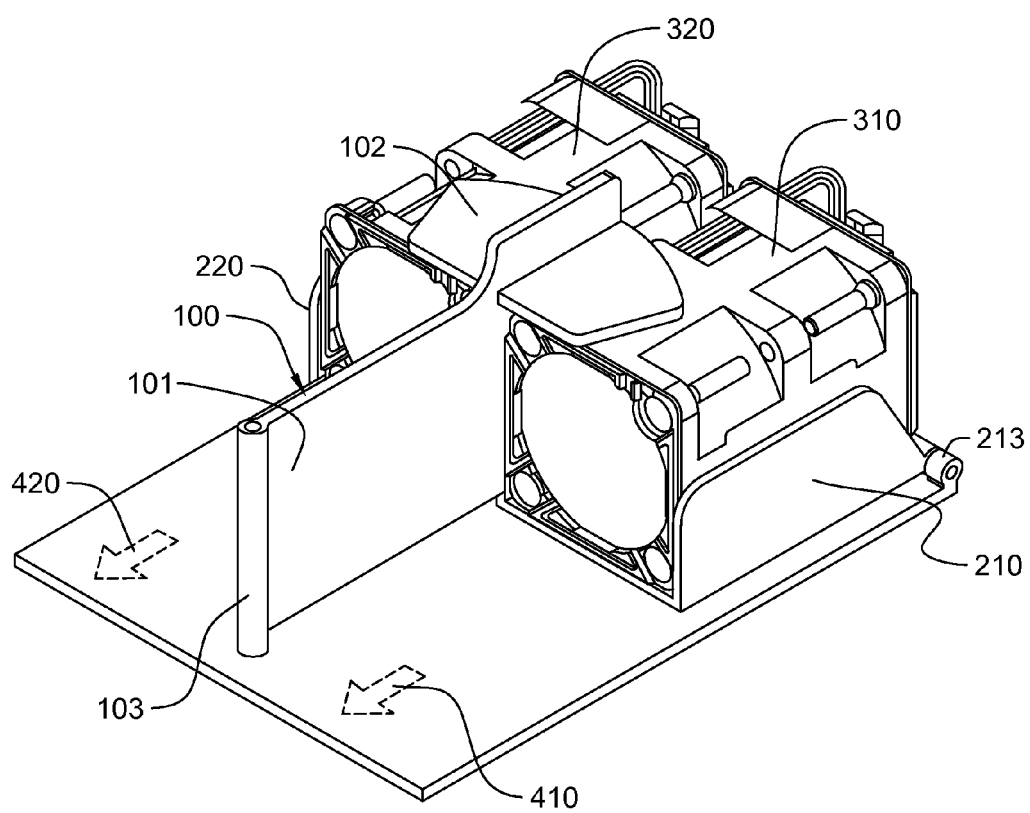
FIG. 1 diagrammatically depicts an embodiment of a cooling apparatus in a home position.

FIG. 1 diagrammatically depicts an embodiment of a cooling apparatus in a home position. The home position may represent a standard operating state with working fans. A movable baffle assembly 100 may include an airflow diverter plate 101 coupled with a fan stop plate 102. The fan stop plate 102 may block removal of a first fan 310 and a second fan 320. The blocking may mechanically occur by the fan stop plate 102 without operator action. The airflow diverter plate 101 may segregate airflow into paths which may be parallel. The airflow diverter plate 101 may direct a first airflow 410 from the first fan 310 and a second airflow 420 from the second fan 320. A fan cradle 210 may hold the first fan 310 and a fan cradle 220 may hold the second fan 320. In other embodiments, more fan cradles may be provided, for example, three fan cradles. In a three fan cradle embodiment, a movable baffle assembly could allow for removal of a single fan while blocking the removal of the two remaining fans. In further embodiments, a two fan cradle or three fan cradle may be provided in which each fan cradle carried a twin fan combination in which the twin fan combination would be the replaceable component.

Figure 2:
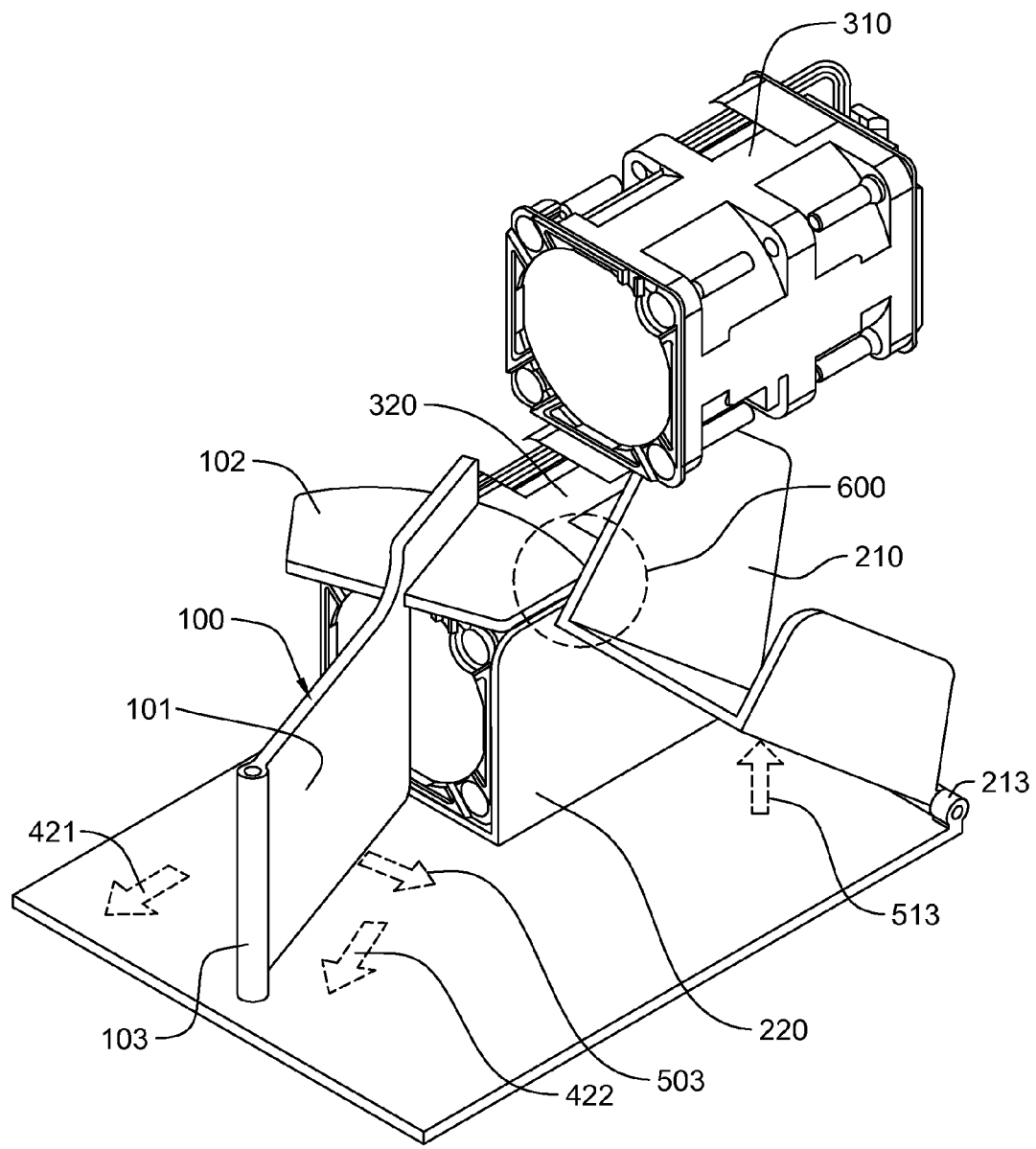
FIG. 2 diagrammatically depicts an embodiment of a cooling apparatus in a swap position.

A cradle biasing mechanism 213 may orient the fan cradle 210. The cradle biasing mechanism 213 may mechanically favor orienting the fan cradle 210 in a swap position as in FIG. 2. However, in the home position depicted in FIG. 1, the fan stop plate 102 may obstruct the cradle biasing mechanism 213 from orienting the fan cradle 210. A baffle biasing mechanism 103 may orient the movable baffle assembly 100. The baffle biasing mechanism 103 may mechanically favor orienting the movable baffle assembly 100 in the home position depicted in FIG. 1. Embodiments according to the disclosure may include spring-loading the cradle biasing mechanism 213 or the baffle biasing mechanism 103. In FIG. 1 or FIG. 2, the spring-loaded feature may be considered to be within the cradle biasing mechanism 213 or the baffle biasing mechanism 103.

FIG. 2 diagrammatically depicts an embodiment of a cooling apparatus in a swap position. The swap position represents a machine operating state where an operator, such as service personnel, may replace a fan. The airflow diverter plate 101 may allocate airflow into paths. The fan stop plate 102 may permit removal of the first fan 310 and block removal of the second fan 320. The blocking of the second fan 320 may mechanically occur by the fan stop plate 102 without operator action. Circle 600 identifies that the fan stop plate 102 may block the second fan 320 from removal. With no mechanical or other restriction, circle 600 also identifies that the first fan 310 may be removed as the fan stop plate 102 may have no effect on either the first fan 310 or the fan cradle 210.

Airflow from the first fan 310 may not exist. The airflow diverter plate 101 may direct airflow 421 and airflow 422 from the second fan 320. Airflow 421 may cool a path that may resemble airflow 420 in FIG. 1. Airflow 422 may cool a path that may resemble airflow 410 in FIG. 1. The second fan 320 may compensate for the increased cooling demands by ramping up in revolutions per minute.

The cradle biasing mechanism 213 may orient the fan cradle 210 in its mechanically favored swap position. According to some embodiments, the cradle biasing mechanism 213 may tilt or rotate a fan cradle from a first position to a second position such as the elevated and tilted position diagrammatically illustrated in FIG. 2. In other aspects, other changes in the mechanical position of the fan cradle may be used to produce the appropriate swap position for a fan while blocking removal of another fan or fans. Unlike the home position depicted in FIG. 1, in a swap position the fan stop plate 102 may unblock the first fan 310 or the fan cradle 210. Arrow 513 represents the course of the disposition to the swap position that the cradle biasing mechanism 213 may prefer.

The baffle biasing mechanism 103 may mechanically favor orienting the movable baffle assembly 100 in the home position but the first fan 310 or the fan cradle 210 may block the movable baffle assembly 100 from returning to the home position. According to some embodiments, the baffle biasing mechanism 103 may pivot or rotate from a first position to a second position such as the pivoted and rotated position diagrammatically illustrated in FIG. 2. In other aspects, other changes in the mechanical position of the movable baffle assembly 100 may be used to produce the appropriate swap position for a fan while blocking removal of another fan or fans. Arrow 503 represents what may constitute the course of the movable baffle assembly 100 to the preferred disposition of the baffle biasing mechanism 103 but for the movable baffle assembly 100 being blocked by fan cradle 210 identified by circle 600. Thus, the embodiment depicted in a swap position in FIG. 2 includes an apparatus that can direct airflow when removing and replacing a fan while also providing for removal of only one fan at a time.

Figure 3:
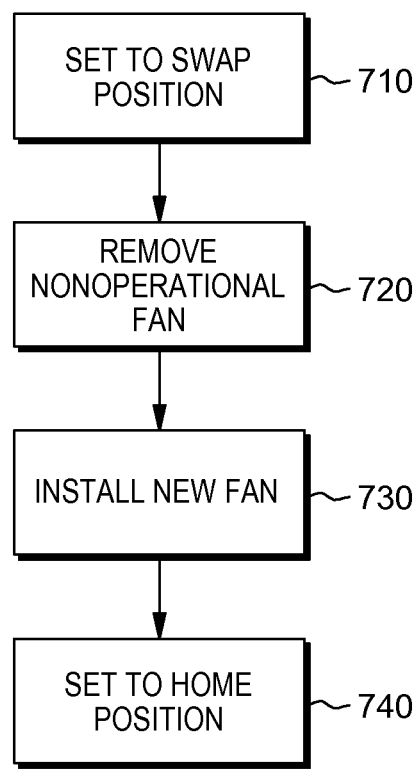
FIG. 3 is a flowchart according to an embodiment of a method to remove and replace an existing fan in an array of fans.

FIG. 3 is a flowchart showing operation 700 in accordance with an embodiment to remove and replace an existing fan in an array of fans. When a fan fails, an operator may replace the failed fan. The operator may manipulate a baffle assembly to set it to a swap position 710. Setting to the swap position 710 may include moving the baffle assembly from the home position shown in FIG. 1 to the swap position shown in FIG. 2. The manipulation may occur to move the movable baffle assembly 100 in either direction, towards fan cradle 210 or towards fan cradle 220, depending on which corresponding fan may need removal. The manipulation may stabilize or lock into place the movable baffle assembly 100. The stabilization or locking may utilize a detent or clip. The manipulation may result in directing airflow from a manner such as 420 in FIG. 1 to a manner such as 421 or 422 in FIG. 2. The manipulation may continue to restrict access to an existing fan such as 320 in FIG. 2. The manipulation may pivot the fan stop plate 102 out of the way to enable the cradle biasing mechanism 213 to orient a fan cradle 210 in its favored swap position, permitting access to an existing fan such as 310 in FIG. 2.

The operator may substitute a replacement fan for an existing fan in an array of fans. The operator may remove a nonoperational fan 720 in an array of fans. The removal may occur in the swap position shown in FIG. 2. The operator may complete the removal manually. The operator may install a new fan 730 in place of the fan removed. The installation may occur in the swap position shown in FIG. 2. The operator may complete the installation manually. The operator may manipulate a fan cradle to set it to a home position 740. Setting to the home position 740 may include orienting a fan cradle such as 210 from the swap position shown in FIG. 2 to the home position shown in FIG. 1. The manipulation may enable a baffle biasing mechanism 103 to orient the movable baffle assembly 100 in the home position as the fan cradle may no longer block the movable baffle assembly 100 from its favored home position. The movable baffle assembly 100 in the home position restricts access to existing fans such as 310 and 320 in FIG. 2. The orientation may stabilize or lock into place the movable baffle assembly 100. The stabilization or locking may utilize a detent or clip. The manipulation may result in directing airflow from a manner such as 421 or 422 in FIG. 2 to a manner such as 420 in FIG. 1.

In other embodiments, the movable baffle assembly may perform the same function of directing or redirecting airflow from multiple cooling fans while allowing removal and replacement of a particular fan unit. Embodiments may exist with more fans and more fan cradles. For example, an embodiment may include a pair of fans on either side of the movable baffle assembly.

What is claimed is:

1. An apparatus for directing airflow, comprising:
   a first fan cradle and a second fan cradle to hold a first fan and a second fan, respectively, the first and second fan cradles being disposed beside one another; and
   a baffle assembly moveable between a home position and a swap position, the baffle assembly comprising an airflow diverter plate having a fan stop plate at a first end, the airflow diverter plate and the fan stop plate being substantially perpendicular to one another, wherein:
      in the home position, the fan stop plate is opposite the first and second cradles, and the airflow diverter plate is lying in a first plane that is substantially perpendicular to the fan stop plate and between the first and second cradles, the airflow diverter plate thereby segregating first and second airflows respectively generated by the first and second fans when the first and second fans are present and operating in the first and second cradles, and
      in the swap position, the fan stop plate is opposite one of the first and second cradles and not opposite the other cradle to thereby block removal of a fan present in the one cradle and allow removal of a fan present in the other cradle, and the first end of the airflow diverter plate is opposite the one cradle to thereby divide an airflow generated by a fan present and operating in the one cradle into third and fourth airflows.

2. The cooling apparatus of claim 1, wherein the airflow diverter plate is substantially planar.

3. The cooling apparatus of claim 1, wherein the fan stop plate is substantially planar.

4. The apparatus of claim 1, wherein in the swap position, the airflow diverter plate is lying in a second plane that is substantially perpendicular to the fan stop plate and intersects the first plane at a non-zero angle.

5. The apparatus of claim 1, wherein in the swap position, the first end of the airflow diverter plate is opposite the one cradle and at a midpoint between a first and a second side of the one cradle.

6. The apparatus of claim 1, wherein the baffle assembly further comprises a baffle biasing mechanism at a second end of the airflow diverter plate opposite the first end, the baffle biasing mechanism pivotable between a first position and a second position to thereby orient the baffle assembly between the home and swap positions.

7. The cooling apparatus of claim 6, wherein the baffle biasing mechanism includes a compressible element.

8. The apparatus of claim 1, wherein each of the fan cradles further comprise a cradle biasing mechanism to allow a fan cradle to tilt, and wherein the cradle biasing mechanisms each include a compressible element.

9. An apparatus for diverting airflow, comprising:
- a first fan cradle to hold a first fan, the first fan cradle having first and second ends, and a first cradle biasing mechanism at the first end of the first fan cradle;
- a second fan cradle to hold a second fan, the second fan cradle having first and second ends, and a second cradle biasing mechanism at the first end of the second fan cradle, wherein the second fan cradle is positioned beside the first fan cradle with the second cradle biasing mechanism adjacent to the first cradle biasing mechanism and the respective first ends of the first and second fan cradles adjacent one another;
- a baffle assembly moveable between a home position and a swap position, the baffle assembly including an airflow diverter plate having a first end and a second end, and a fan stop plate at the first end of the airflow diverter plate, wherein the airflow diverter plate and the fan stop plate are substantially perpendicular to one another;
- a baffle biasing mechanism at the second end of the airflow diverter plate, the baffle biasing mechanism pivotable between a first position and a second position to thereby orient the baffle assembly between the home and swap positions; and
- a locking mechanism to hold the baffle assembly in the home position or the swap position,
- wherein the first end of the airflow diverter plate is in a location proximate to the second end of one of the first and second fan cradles in the swap position to thereby position the fan stop plate to block removal of a fan in the one fan cradle.

10. The apparatus of claim 9, wherein the first end of the airflow diverter plate is in a location proximate to the second ends the first and second fan cradles in the home position to thereby position the fan stop plate to block removal of a fan in the first fan cradle and a fan in the second fan cradle.

11. The apparatus of claim 9, wherein the baffle biasing mechanism is spring loaded.

12. The apparatus of claim 9, wherein the first and second cradle biasing mechanisms are spring loaded.

13. A method to remove and replace an existing fan in an array of fans, comprising:
- manipulating an airflow diverter plate from a home position to a swap position, wherein a baffle assembly comprises the airflow diverter plate and a fan stop plate, the airflow diverter plate having the fan stop plate at a first end, the airflow diverter plate and the fan stop plate being substantially perpendicular to one another, and the baffle assembly is positioned in front of a first fan cradle and a second fan cradle to hold a first fan and a second fan, respectively, the first and second fan cradles being disposed beside one another, wherein:
  - in the home position, the fan stop plate is opposite the first and second cradles, and the airflow diverter plate is lying in a first plane that is substantially perpendicular to the fan stop plate and between the first and second cradles, the airflow diverter plate thereby segregating first and second airflows respectively generated by the first and second fans when the first and second fans are present and operating in the first and second cradles, and
  - in the swap position, the fan stop plate is opposite one of the first and second cradles and not opposite the other cradle to thereby block removal of a fan present in the one cradle and allow removal of a fan present in the other cradle, and the first end of the airflow diverter plate is opposite the one cradle to thereby divide an airflow generated by a fan present and operating in the one cradle into third and fourth airflows;
- substituting a replacement fan for the fan in the other cradle;
- manipulating the airflow diverter plate from the swap position to the home position.

14. The method of claim 13, further comprising increasing the speed of a fan present and operating in the one cradle when the baffle assembly is in the swap position.

* * * * *